(12) United States Patent
Kolesnychenko et al.

(10) Patent No.: US 7,075,617 B2
(45) Date of Patent: Jul. 11, 2006

(54) DEVICE MANUFACTURING METHOD AND A LITHOGRAPHIC APPARATUS

(75) Inventors: Aleksey Yurievich Kolesnychenko, Helmond (NL); Ralph Kurt, Eindhoven (NL); Carolus Ida Maria Antonius Spee, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 57 days.

(21) Appl. No.: 10/976,178

(22) Filed: Oct. 29, 2004

(65) Prior Publication Data
US 2005/0148211 A1  Jul. 7, 2005

(30) Foreign Application Priority Data
Oct. 30, 2003  (EP)  .................. 03078421

(51) Int. Cl.
*G03B 27/42* (2006.01)
(52) U.S. Cl. .................. 355/30; 355/53; 355/77; 430/311
(58) Field of Classification Search .............. None
See application file for complete search history.

(56) References Cited

U.S. PATENT DOCUMENTS 4,660,297 A   4/1987  Danielson
6,323,463 B1  11/2001 Davis et al.
6,535,270 B1  3/2003  Murayama
2003/0035087 A1  2/2003  Murayama

FOREIGN PATENT DOCUMENTS

| EP | 0 709 635 A1 | 5/1996 |
| EP | 0 719 979 A2 | 7/1996 |
| EP | 0 719 979 A3 | 5/1997 |
| JP | 09283401 | 10/1997 |
| WO | WO95/03622 | 2/1995 |
| WO | WO01/32531 A1 | 5/2001 |

OTHER PUBLICATIONS

A. Berman, "Walter vapor in vacuum systems," *Vacuum*, 1996, 47(4):327-332, XP000572451.
K. Tatenuma et al., "Quick acquisition of clean ultrahigh vacuum by chemical process technology," *Journal of Vacuum Science & Technology*, 1993, 11(4):1719-1724, XP000403685.

*Primary Examiner*—D. Rutledge
(74) *Attorney, Agent, or Firm*—Pillsbury Winthrop Shaw Pittman LLP (57) ABSTRACT

A device manufacturing method is disclosed. The method includes patterning a beam of radiation with a patterning device, projecting the patterned beam of radiation onto a target portion of a substrate, supplying a chemical reagent to a chamber that holds the patterning device and/or the substrate, and removing water from the chamber with use of the chemical reagent.

28 Claims, 3 Drawing Sheets

DEVICE MANUFACTURING METHOD AND A LITHOGRAPHIC APPARATUS

CROSS-REFERENCE TO RELATED APPLICATIONS

This application claims the benefit of priority from European Patent Application No. 3078421.9, filed Oct. 30, 2003, the entire content of which is incorporated herein by reference.

FIELD

The present invention relates to a device manufacturing method, and further relates to a lithographic apparatus for carrying out such a method.

BACKGROUND

A device manufacturing method and lithographic apparatus may be used, for example, in the manufacture of integrated circuits (ICs). In that circumstance, a patterning device, such as a mask, may be used to generate a circuit pattern corresponding to an individual layer of the IC, and this pattern may be imaged onto target portions, including dies or die parts, on a substrate (e.g. a silicon wafer) that has a layer of radiation-sensitive material (resist). In general, a single substrate contains a network of target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction), while synchronously scanning the substrate parallel or anti-parallel to this direction.

The method may be at least partially carried out in vacuum, more specifically in a vacuum chamber, and/or at atmospheric pressure. The application of vacuum may be desired, for example, to provide a relatively contamination-free environment to carry out the manufacturing method, so that devices having small features may be made with high precision. The use of vacuum may be desired to prevent absorption of the projection beam.

A problem of the known method is that a large amount of residual water may be present in the chamber, which may lead to degradation, for example, oxidation, of parts of the illumination system and/or the patterning device used in the manufacturing method. The amount of water in the chamber may even rise due to water that originates from the substrates to be treated, which substrates are brought into the chamber from an environment and may include adsorbed water. The degradation of the illumination system and/or patterning device may impair a desired imaging performance of the manufacturing method. The degradation may further lead to high maintenance and operating cost, a low machine life time, a low productivity, which may result in high costs of the devices manufactured thereby.

SUMMARY

It is an aspect of the present invention to improve the device manufacturing method. In particular, it is an aspect of the present the invention to provide a device manufacturing method that has a high availability and/or productivity.

According to an embodiment of the invention, there is provided a device manufacturing method in which a substrate is provided, a projection beam of radiation is provided using an illumination system, and a patterning device is used to impart the projection beam with a pattern in its cross-section. The patterned beam of radiation is projected onto a target portion of the substrate, and at least part of the method is carried out in at least one chamber. At least one chemical reagent is supplied to the chamber for removing water from the chamber.

According to an embodiment of the invention, there is provided a device manufacturing method that includes patterning a beam of radiation with a patterning device, projecting the patterned beam of radiation onto a target portion of a substrate, supplying a chemical reagent to a chamber that holds the patterning device and/or the substrate, and removing the water from the chamber with use of the chemical reagent.

Consequently, degradation of apparatus parts used in the method, such as the projection system and/or patterning device, under the influence of water may be prevented or at least diminished, which may lead to lower operating costs, a longer machine life time, which may result in less expensive devices manufactured thereby. The chemical reagent may be supplied to the chamber, for example, before, during and/or after the substrate is illuminated by the projection beam. The chemical reagent may be used to achieve a certain desired vacuum level relatively fast and easy, for the case that the chamber is a vacuum chamber. The chemical reagent may, for example, react with water to form volatile substances. The chemical reagent may, for example, react with water in a decomposition reaction, a complexation reaction and/or one or more other reactions.

It is to be noted, that the paper "Quick acquisition of clean ultrahigh vacuum by chemical process technology" of K. Tatenuma et al. (J. Vac. Sci. Technol. A, Vol. 11, No. 4, July/August 1993, p 1719–1724) describes a method, in which adsorbed water may be removed from a test chamber by chemical treatment to assist in pumping the chamber down from atmospheric pressure to a certain vacuum pressure. The paper "Acquisition of clean ultrahigh vacuum using chemical treatment", K. Tatenuma et al. (J. Vac. Sci. Technol. A, Vol. 16, No. 4, July/August 1998, p 2693–2697) describes a method to remove adsorbed water from a test tube using dichloropropane. The content of these papers are incorporated herein by reference. These papers do not disclose or suggest that chemical removal of water may be used in a device manufacturing method according to the present invention. The present invention is based on the inventive concept that chemical treatment of a chamber for water removal, for example, as described in the papers of Tatenuma et al., may be particularly advantageous when applied in a device manufacturing method in which a patterned beam of radiation is projected onto a target portion of a substrate.

According to an embodiment of the invention, there is provided a lithographic apparatus that includes: an illumination system for providing a projection beam of radiation, and a support structure for supporting a patterning device. The patterning device serves to impart the projection beam with a pattern in its cross-section. The apparatus also includes a substrate table for holding a substrate, and a projection system for projecting the patterned beam onto a target portion of the substrate. The apparatus also includes at least one chamber. The apparatus further includes at least one reagent supplier the is arranged to supply at least one chemical reagent to the chamber. The reagent is chemically active with water.

According to an embodiment of the present invention, there is provided a lithographic apparatus that includes an illumination system for conditioning a beam of radiation, and a support for supporting a patterning device. The patterning device serves to impart the beam of radiation with a pattern in its cross-section. The apparatus also includes a substrate table for holding a substrate, a projection system for projecting the patterned beam onto a target portion of the substrate, a chamber that holds the support, or the patterning device, or the projection system, or the substrate table, or the substrate, or any combination thereof, and a chemical reagent supply constructed and arranged to supply a chemical reagent to the chamber, the reagent being chemically active with water.

This device may provide the above-mentioned advantages. In particular, water may be removed easily from the chamber by the chemical reagent, when the reagent is supplied to that chamber by the reagent supplier. Therefore, water sensitive parts of the apparatus, for example, parts of the projection system and/or patterning device, may be exposed to relatively little water during use, so that these water sensitive parts may maintain a high level of energy transmission and/or patterning accuracy. Further, the lifetime of the water sensitive apparatus parts may be prolonged. If desired, a certain vacuum level of the chamber may be achieved and maintained relatively fast and economically by supplying the chemical reagent to the chamber, which may lead to a higher machine availability and a high productivity.

According to an embodiment of the present invention, there is provided a method for removing water from a chamber of a lithographic apparatus. The method includes supplying a chemical reagent to the chamber to remove the water from the chamber. The chemical reagent includes a compound selected from the group consisting of (ortho) carbonate/formate esters, carboxylic acid anhydrides, carboxylic acid esters, acetales, imines, trimethylsilyl ethers, silazanes, isocyanates, carbodiimides, and oxazolidines.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including X-ray radiation, ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" as used herein should be broadly interpreted as referring to a device that may be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, NA-stop mechanisms and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions; in this manner, the reflected beam is patterned. In each example of patterning device, the support structure may be a frame or table, for example, which may be fixed or movable as needed and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate for example, for the exposure radiation being used, or for other factors such as the use of an immersion fluid or the use of a vacuum. The meaning of the term 'vacuum' should be construed broadly in the context of the present invention. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

The invention further relates to a method for removing water from a chamber, wherein at least one chemical reagent is supplied to the chamber for removing water from the chamber. The invention aims to provide a chemical reagent such that the water may be removed relatively fast and efficient from the chamber.

To that aim, the method according to the invention is characterized in that the at least one chemical reagent includes at least one of the compounds selected from the group consisting of:

(ortho)carbonate/formate esters, having for example, the formula C(OR)4, C(O)(OR)2 or R'C(OR)3, in which R is preferably a methyl or ethyl group, and R' is preferably a hydrogen atom or a methyl group;

Acetales not including acetone-dimethyl-acetal, particularly acetales having the formula R'$_2$C(OR)$_2$ in which R is preferably a methyl or ethyl group, and R' is preferably a hydrogen atom or a methyl group;

Carboxylic acid anhydrides, particularly carboxylic acid anhydrides having the formula RC(O)—O—C(O)R in which R is preferably a methyl group;

Carboxylic acid esters, particularly carboxylic esters having the formula R'C(O)OR, in which R is preferably (CH$_3$)$_3$Si and R' is preferably a hydrogen atom or a methyl group;

Imines, particularly imines having the formula RN=CR'R", in which R is preferably a hydrogen atom or a methyl group, and R' is preferably a methyl or ethyl group and R" is preferably a methyl or ethyl group;

Trimethylsilyl ethers, particularly trimethylsilyl ethers having the formula (CH$_3$)$_3$SiOR, in which R is preferably a methyl or ethyl group;

Silazanes, particularly silanes having the formula (CH$_3$)$_3$SiNR$_2$ or ((CH$_3$)$_3$Si)$_2$NR' in which R is preferably a methyl or ethyl group, and R' is preferably a hydrogen atom or a methyl group;

Isocyanates, particularly isocyanates having the formula RN=C=O in which R is preferably a methyl group, an ethyl group or a propyl group;

Carbodiimides, particularly carbodiimides having the formula R$_1$N=C=NR$_2$ in which R$_1$ is the same as R$_2$, and R$_1$ is a propyl or butyl group, or where R$_1$ is different from R$_2$, and R$_1$ is an ethyl group and R$_2$ is a butyl group, or R$_1$ is a butyl group and R$_2$ is an ethyl group;

Oxazolidines, particularly oxazolidines having the following formula:

in which R is preferably an ethyl group, R' is a methyl group, and R" is 3-(methyl)-butane.

Surprisingly, it has been found that the compounds may provide a fast removal of water from the chamber. The fast removal of the water may be advantageous in case the chamber includes components thta are sensitive to water and/or may be harmed or damaged by water. Fast removal of water may be desired in case the chamber has to be brought to a certain vacuum level. The present method for removing water from a chamber may be applied in different fields, for example, vacuum technology, semiconductor manufacturing technology, lithography, deposition, etching, and/or any other field where such water removal is desired.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
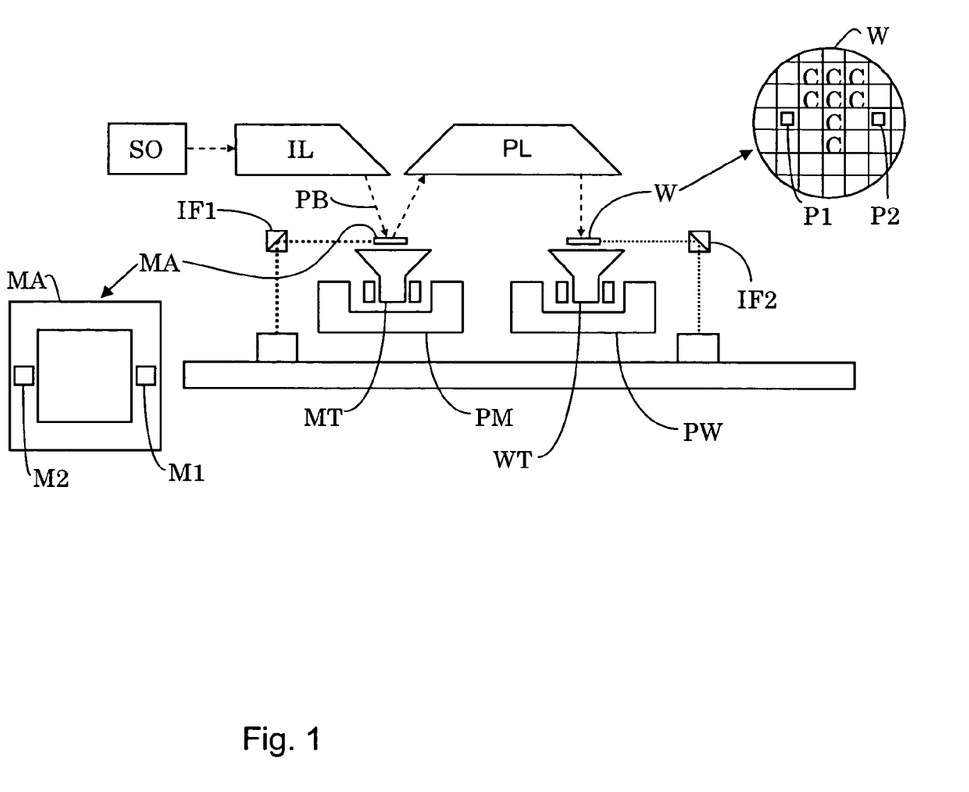
FIG. 1 depicts a lithographic apparatus.

FIG. 1 schematically depicts a lithographic apparatus which includes: an illumination system (illuminator) IL for providing a projection beam PB of radiation (e.g. UV or EUV radiation), a first support structure (e.g. a mask table) MT for supporting a patterning device (e.g. a mask) MA and connected to a first positioner PM for accurately positioning the patterning device with respect to item PL, a substrate table (e.g. a wafer table) WT for holding a substrate (e.g. a resist-coated wafer) W and connected to a second positioner PW for accurately positioning the substrate with respect to item PL, and a projection system (e.g. a reflective projection lens) PL for imaging a pattern imparted to the projection beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector including, for example, suitable collecting mirrors and/or a spectral purity filter. In other cases the source may be integral part of the apparatus, for example, when the source is a mercury lamp. The source SO and the illuminator IL, may be referred to as a radiation system.

The illuminator IL may include an adjusting device for adjusting the angular intensity distribution of the beam. Generally, at least the outer and/or inner radial extent (commonly referred to as σ-outer and σ-inner, respectively) of the intensity distribution in a pupil plane of the illuminator may be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioner PW and position sensor IF2 (e.g. an interferometric device), the substrate table WT may be moved accurately, e.g. so as to position different target portions C in the path of the beam PB. Similarly, the first positioner PM and position sensor IF1 may be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus may be used in the following example modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C may be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as needed after each movement of the substrate table WT or in between successive radiation pulses during a scan. This mode of operation may be readily applied to maskless lithography that utilizes a programmable patterning device, such as a programmable mirror array of a type as referred to above.

Combinations and/or variations on the above described modes of use or entirely different modes of use may also be employed.

Figure 2:
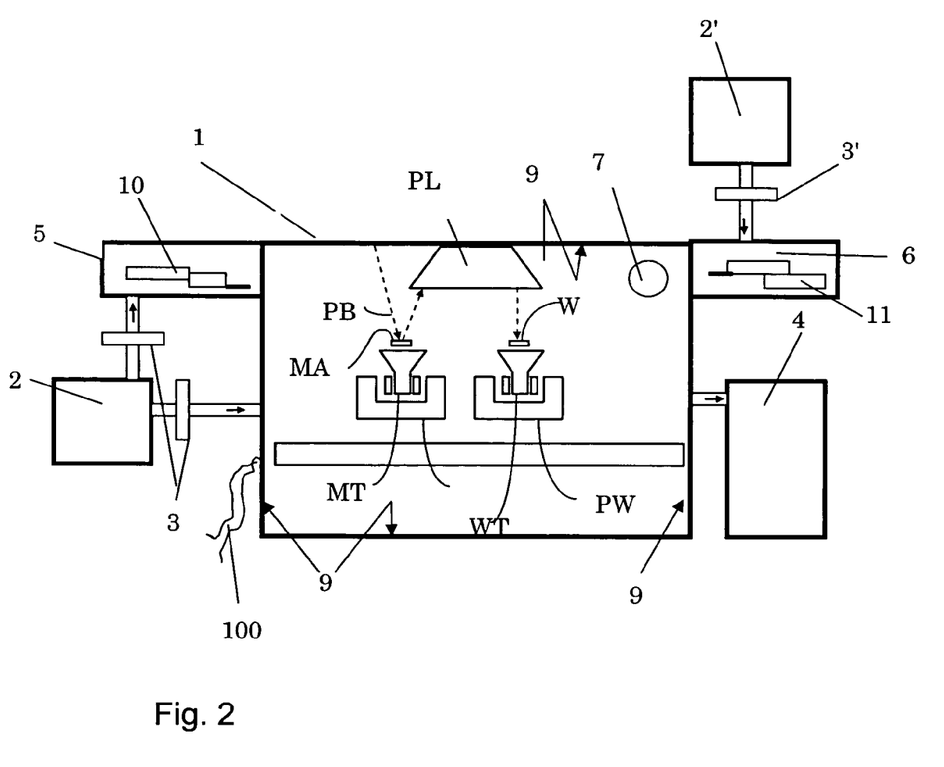
FIG. 2 schematically depicts a lithographic apparatus according to an embodiment of the invention.

FIG. 2 shows an embodiment of a lithographic apparatus according to the present invention. The apparatus shown in FIG. 2 is arranged for carrying out a device manufacturing method as described above concerning the embodiment shown in FIG. 1. To this aim, the apparatus of FIG. 2 includes an illumination system for providing a projection beam PB of radiation, a mask support structure MT for supporting a mask MA, a substrate table WT for holding a substrate W, as well as a projection system PL for projecting the patterned beam PB onto a target portion C of the substrate W. For clarity, the illumination system is not shown in FIG. 2.

The embodiment of FIG. 2 includes a main vacuum chamber 1 within which the mask support structure MT, mask MA, projection system PL and substrate table WT are located. The apparatus includes at least one vacuum pump 4 which is coupled to the main vacuum chamber 1 for creating and maintaining a certain vacuum level therein. The main chamber 1 includes a heater 100, which are known from the art and may include, for example, one or more electrical heating wires 100 extending through or along the wall 9 of the chamber. The heater 100 is arranged for heating the wall 9 of the chamber 1 to remove compounds which are adsorbed thereto. In FIG. 2, only an exterior part of the heater 100 is depicted. The heater 100 may further be arranged, for example, for heating at least part of the content of the chamber 1.

The present embodiment further includes a mask handler 10 and a substrate handler 11 for handling masks MA and substrates W respectively. Each handler 10, 11 may be constructed in various ways, for example, including on or more actuators, robot arms, guiding means and such. The mask handler 10 is positioned in a mask load-lock chamber 5. The substrate handler 11 is situated in a substrate load-lock chamber 6. The handlers 10, 11 are partly movable into and out of the main vacuum chamber 1 for transporting masks MA and substrates W thereto and therefrom, particularly for replacing masks MA and substrates W. The load-locks 5, 6 and handlers 10, 11 as such may be known from practice. Particularly, each load-lock 5, 6 is a vacuum chamber which may be entered from the main vacuum chamber 1, as well as from an environment of the apparatus via respective, hermetically closable entrances. The load-lock chambers 5, 6 may also be coupled to one or more vacuum pumps for providing suitable vacuum levels therein. These lock-lock pumps are not shown in FIG. 2.

According to an embodiment of the invention, the apparatus includes at least one supply arrangement 2, 2', 3, 3' that is arranged to supply at least one chemical reagent to the vacuum chambers 1, 5, 6. The reagent is chemically active with water. The embodiment of FIG. 2 includes two supply arrangements. The first supply arrangement includes a first reservoir 2 that contains the at least one chemical reagent. The first reservoir 2 may be brought in fluid communication with the main vacuum chamber 1 and the mask load-lock chamber 5 via respective supply lines 3. Each of these supply lines 3 includes a flow regulator for regulating the amount of fluid which flows there through towards the respective vacuum chamber 1, 5. The second supply arrangement includes a second reservoir 2' that contains the at least one chemical reagent. The second reservoir 2' is coupled to the substrate load-lock 6 via a supply line 3', which also includes a flow regulator.

In the present embodiment, each fluid reservoir (2,2') is located outside the vacuum chambers 1, 5, 6. However, one or more reservoirs may also be integrated or located inside one or more of the vacuum chambers 1, 5, 6. The location of the reservoirs 2, 2' depends, among other things, on the nature of the at least one chemical reagent and the conditions in the vacuum chambers 1, 5, 6. For example, the chemical reagent may be solid and/or liquid when it is contained in the reservoirs 2, 2'. Then, the chemical reagent may be sublimated or evaporated into a vacuum chamber 1, 5, 6, provided that the nature of the chemical reagent and vacuum chamber conditions as the chamber pressure and temperature are suitable thereto. On the other hand, the chemical reagent may be at least partially gaseous, and, for example, pressurized, when contained in the reservoir 2, 2'.

The chemical reagent serves to remove water from the vacuum chambers 1, 5, 6. To this aim, the chemical reagent is preferably active with water for increasing the desorption of water, particularly such that the water may be more easily desorbed and/or removed from parts of the apparatus, such as the vacuum chamber walls 9, a reticle MA, projection system PL and/or from substrates W. For example, the chemical reagent may be active with water for breaking O—H bonds of water molecules which are adsorbed to other water molecules and/or to parts of the apparatus and/or to substrates W. Herein, the breaking of intermolecular O—H bonds between water molecules is particularly advantageous to remove relatively thick multilayers of adsorbed water from the apparatus. Furthermore, the chemical reagent may be active with water, for example, to form at least one reaction product with water, such that the reaction product has a lower adsorption energy than water, particularly concerning adsorption to parts of the apparatus, such as the vacuum chamber walls 9, a reticle MA, a projection system PL and/or substrates W. Further, the reaction product preferably has weaker intermolecular forces than water. The chemical reagent may form, for example, at least one complex with water, such that the complex has a lower adsorption energy and/or weaker intermolecular forces than water. According to an embodiment, the chemical reagent decomposes water at least partly into volatile substances. Volatile substances may be pumped from the vacuum chambers 1, 5, 6 by the at least one vacuum pump 4 of the apparatus. The term 'volatile substances' may be construed as meaning any atoms, molecules and/or other substances that are in a gaseous phase in the respective chamber at the pressure and temperature thereof. Particularly, the volatile substances have a higher vapor pressure than water.

The at least one chemical reagent may include, for example, at least one of the compounds selected from the group consisting of silicon containing compounds, halogen containing compounds, and hydrocarbon compounds. The hydrocarbon compounds may optionally contain one or more oxygen atoms and/or one or more nitrogen atoms. Particularly, the hydrocarbons compounds may be $C_xH_yO_zN_w$ compounds (z, w>=0) and may optionally include, for example, one or more silicon and/or halogen atoms.

Examples of the at least one reagent are: silane compounds, trimethyl-chloro-silane, dimethyl-dichloro-silane; monomethyl-trichloro-silane, tetrachloro-silane, dichloro-propane, dibromo-propane, nitrosyl-chloride, carbonyl-chloride (phosgene), carbonyl-fluoride, diborane, chlorine, fluorine, fluorine mixed with carbon monoxide, thionyl-bromide, iodomethyl-propane, acetyl-chloride, acetone-dimethyl-acetal, ethanol, hexane, oxyhalogen compounds. Examples of the oxyhalogen compounds have the formulas $POCl_3$, $VOCl_3$, $SOCl_2$, $SO_2Cl_2$, $CH_3SO_2CL$, $SeOCl_2$, and $CrO_2Cl_2$.

Further examples of the at least one reagent are the following, numbered (1) to (10):

(1)—(ortho)carbonate/formate esters, having, for example, the formula C(OR)4, C(O)(OR)2 or R'C(OR)3 in which R is preferably a methyl or ethyl group and R' preferably is a hydrogen atom or a methyl group;

(2)—Acetales other than acetone-dimethyl-acetal, particularly acetales having the formula $R'_2C(OR)_2$, in which R is preferably a methyl or ethyl group and R' is preferably a hydrogen atom or a methyl group;

(3)—Carboxylic acid anhydrides, particularly carboxylic acid anhydrides having the formula RC(O)—O—C(O)R in which R is preferably a methyl group;

(4)—Carboxylic acid esters, particularly carboxylic esters having the formula R'C(O)OR in which R is preferably $(CH_3)_3Si$ and R' is preferably a hydrogen atom or a methyl group. R may also be, for example, a methyl or ethyl group;

(5)—Imines, particularly imines having the formula RN═CR'R" in which R is preferably a hydrogen atom or a methyl group, and R' is preferably a methyl or ethyl group, and R" is preferably a methyl or ethyl group. R' may also be, for example, a butyl group, and R" may also be, for example, a butyl group;

(6)—Trimethylsilyl ethers, particularly trimethylsilyl ethers having the formula $(CH_3)_3SiOR$ in which R is preferably a methyl or ethyl group;

(7)—Silazanes, particularly silanes having the formula $(CH_3)_3SiNR_2$ or $((CH_3)_3Si)_2NR'$ in which R is preferably a methyl or ethyl group, and R' is preferably a hydrogen atom or a methyl group;

(8)—Isocyanates, particularly isocyanates having the formula RN═C═O, in which R is preferably a methyl group, an ethyl group, or a propyl group;

(9)—Carbodiimides, particularly carbodiimides having the formula $R_1N$═C═$NR_2$ in which $R_1$ is preferably the same as $R_2$, and $R_1$ is a propyl or butyl group. $R_1$ may also be different from $R_2$. $R_1$ may be an ethyl group and $R_2$ may be a butyl group, or $R_1$ may be a butyl group and $R_2$ may be an ethyl group (all of which are commercially available);

(10)—Oxazolidines, for example, oxazolidines having the following formula:

in which R is preferably an ethyl group, R' is preferably a methyl group, and R" is preferably 3-(methyl)-butane (commercial available, for example, as Zoldine MS-Plus of the Angus Chemical Company, or Incozol 2 of Industrial Copolymers Limited).

Examples (1)–(10) may be used, for example, in a lithographic manufacturing method and/or any other method for removing water from one or more chambers. In the examples (1)–(10), at least some of the R, R', R", $R_1$ and $R_2$ groups are preferably alkyl groups. More preferably, at least some of the R, R', R", $R_1$ and $R_2$ are methyl, ethyl, propyl and/or butyl groups, as has been described above in some of the examples. Each of the R, R', R", $R_1$ and $R_2$ may also be another group, for example, an aryl group.

Preferably, the at least one chemical reagent as such is also a volatile compound, so that it may be removed from the vacuum system by the at least one vacuum pump 4.

The embodiment of FIG. 2 further includes at least one UV light source 7 that may be arranged to illuminate at least part of an inner surface 9 of the main vacuum chamber 1 and/or its content with UV light, preferably deep UV (DUV) light with a wavelength of less than about 400 nm. This light source 7 is additional to the above-mentioned radiation source and illuminating system IL for generating the projection beam PB. One or more such additional light sources 7 may also be provided in the load-lock chambers 5, 6.

During use, the at least one chemical reagent is supplied to one or more of the vacuum chambers 1, 5, 6 by the supply arrangements 2, 3, 2', 3' for removing water from the vacuum chambers. The chemical reagent may, for example, lower the desorption energy of water, decompose water into volatile compounds and/or form volatile complexes with water, so that water may be removed from the vacuum chambers 1, 5, 6 with ease by the at least one vacuum pump 4.

Figure 3:
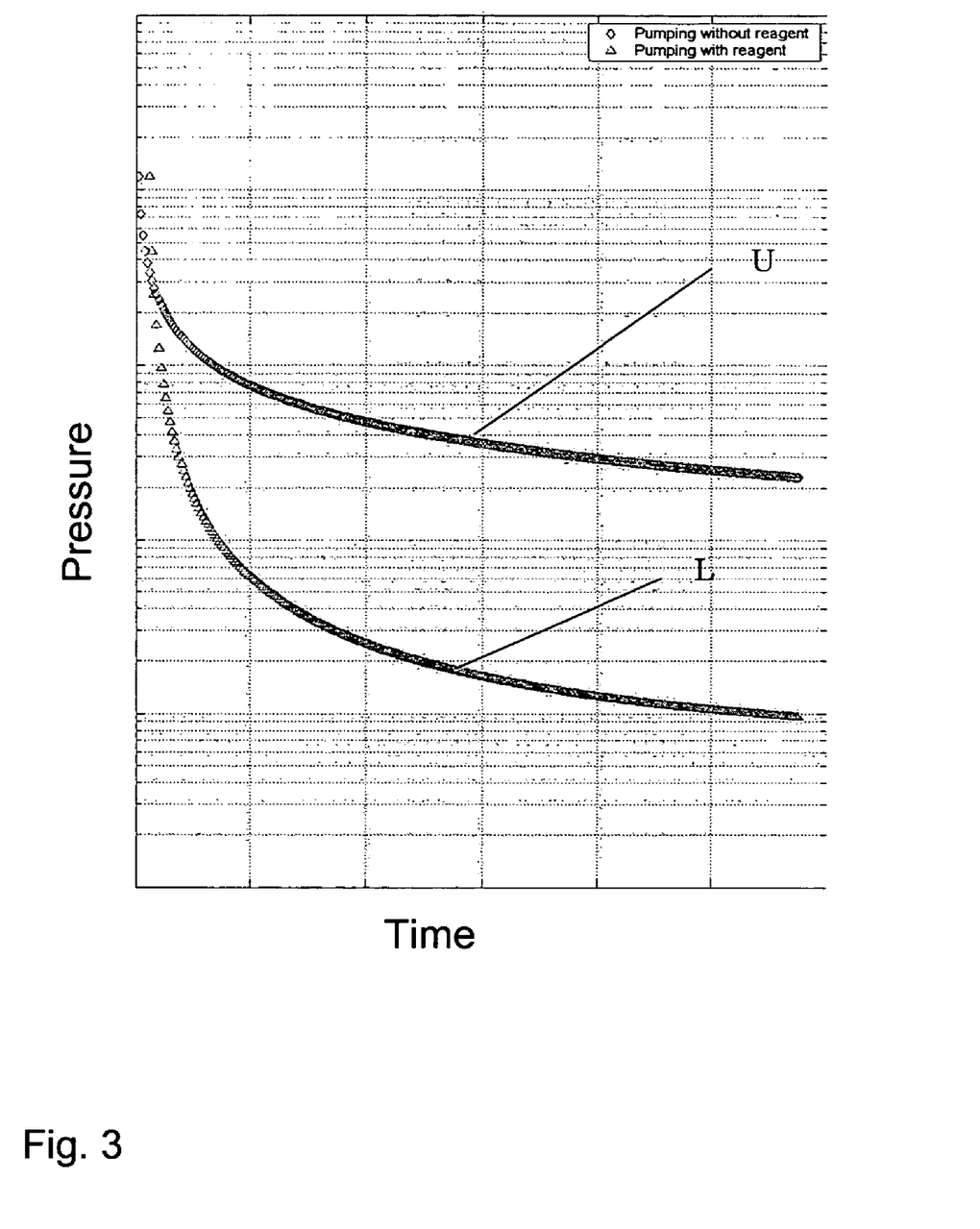
FIG. 3 shows a result of an example of the present invention.

FIG. 3 shows simulation results of an example of the present invention in which a vacuum chamber is pumped down to a certain vacuum level by one or more vacuum pumps. FIG. 3 is a graph in which line U, including symbols '◇', depicts the chamber pressure against time for pumping results which are obtained when no reagent is supplied to the vacuum chamber. In FIG. 3, line L, including symbols 'Δ', shows the results of the chamber pressure when a chemical reagent was supplied to the chamber for removing water therefrom. From FIG. 3, it follows that the start of the pumpdown of curve L is later than the pumpdown of curve U. The pumpdown start of curve L is delayed due to the supply of the reagent to the vacuum chamber before the start of the pumpdown and/or during the pumpdown. From FIG. 3 it follows that curve L falls below curve U very fast because of the removal of water from the chamber caused by the reagent. Thus, the application of the reagent may leads to a faster pumping down of the vacuum chamber.

The interiors of the vacuum chambers 1, 5, 6 may be irradiated by the UV light sources 7 to remove water therefrom, for example, by speeding up the chemical reaction between the chemical reagent and water and/or by breaking intermolecular O—H water adsorption bonds. The water may be removed from the vacuum chambers when the apparatus is at a certain desired operating temperature, for example, room temperature or thereabouts. Consequently, no or only a mild baking out procedure may be applied to obtain or maintain a desired vacuum level in the apparatus, so that damage to and/or misalignment of heat sensitive apparatus components may be prevented. The mild baking out procedure may be applied by using the heater 100 (see FIG. 2). During such mild baking, the wall of the main chamber 1 is heated to a certain relatively low baking temperature, preferably a baking temperature of about 100° C. or less, particularly about 60° C. or less, to promote the removal of substances which are adsorbed thereto. More preferably, the temperature is about room temperature.

The fast and efficient removal of the water from the apparatus may prevent degradation of water sensitive apparatus parts, such as mirrors, the reticle or other parts. To avoid degradation of water sensitive parts, the partial pressure of the water in the main vacuum chamber 1 may be reduced to less than about $10^{-5}$ mbar, more preferably less than about $10^{-7}$ mbar or even less than about $10^{-9}$ mbar. The at least one vacuum chamber may be pumped down relatively fast from atmospheric pressure to a desired vacuum level by the use of the reagent.

The method according to the present invention may be carried out in several ways. For example, the at least one chemical reagent may be supplied to the vacuum chamber 1 before and/or after the patterned beam of radiation PB is projected onto the substrate W. Each substrate may bring some residual water into the vacuum system when it is transported therein, via the substrate load-lock 6. Then, it may be advantageous to supply the chemical reagent to the substrate load-lock chamber 6 before the substrate W is transported to the main vacuum chamber by the substrate handler 11, so that the residual water may be removed from the substrate W in the load-lock chamber 6. In the same manner, the chemical reagent may be supplied to the main vacuum chamber 1 when a substrate W is transported therein and/or has just been installed onto the substrate table WT, again to remove the residual water. After the substrate-bound water has been removed and/or decomposed by the chemical reagent and has been pumped from the system, the substrate W may be illuminated by the radiation beam PB, as described above with reference to FIG. 1. When the above describes substrate illumination process has ended, the chemical reagent may again be supplied to one or more of the vacuum chambers of the apparatus 1, 5, 6 for water removal and/or decomposition.

The chemical reagent may be used to chemically remove water from the apparatus and reticles MA during and after transport of the reticles MA via the reticle load-lock 5. To that aim, the reagent may be supplied to the reticle load-lock chamber 5 and/or to the main vacuum chamber 1, using the respective reagent supply arrangement 2, 3.

During use, the amount of chemical reagent that is to be supplied to the vacuum chambers 1, 5, 6 may be controlled precisely using the flow controllers of the supply lines 3, 3'. The apparatus preferably includes a control unit, not shown, for example, a micro-controller and/or computer, for regulating the flow of the reagent during the use of the apparatus. A relatively large amount of reagent may, for example, be supplied to the main vacuum chamber 1 when no lithographic process is carried out therein. Then, the excess amount of supplied reagent may be pumped from the main chamber 1 by the vacuum pumps 4.

According to a further embodiment, the chemical reagent may be supplied to the main vacuum chamber 1 at least during part of the period when the patterned beam of radiation PB is projected onto the substrate W. In this case, a relatively low amount of reagent may be continuously or periodically supplied to the main chamber 1, so that the vacuum level of the main chamber 1 is substantially not or only slightly affected thereby. This may have the advantage that water may also be desorbed, removed and/or decomposed in the main chamber 1 when the substrate illumination process is carried out therein. Again, the at least one vacuum pump 4 may pump any excess reagent from the main chamber 1.

When the main vacuum chamber 1, the substrate load-lock chamber 6, and/or reticle load-lock chamber 5 have been brought to substantially atmospheric pressure and should be pumped down to a certain vacuum level again, the respective chambers 1, 5, 6 may be flushed with a large amount of the chemical reagent for quick water removal.

While specific embodiments of the invention have been described above, it will be appreciated that the invention may be practiced otherwise than as described, within the scope of the claims. The description is not intended to limit the invention.

The chemical reagent may include one or more suitable chemicals. Preferably, the reagent and the reaction products do not react with materials used in the lithographic apparatus, while they have a relatively low adsorption energy with the materials used in the apparatus. Furthermore, one or more catalysts may be used in combination with the at least one reagent to remove the water from the chamber, particularly depending on the nature of the reagent.

Furthermore, the term 'a relative low adsorption energy' may be understood as a low energy of absorption of the relevant compound to the vacuum chamber wall 9, other apparatus parts and/or substrates, relative to energy of adsorption of water to that vacuum chamber wall 9, other apparatus parts and/or substrates.

The apparatus may include one or more chambers, for example, the main chamber 1, one or more substrate handling chambers, one or more reticle handling chambers, a numerical aperture stop handling chamber and/or other chambers. Then, the chemical reagent may be supplied to one or more of the chambers. One or more of the chambers may be irradiated by UV light to remove water therefrom.

During use, each chamber 1, 5, 6 may be at a certain vacuum pressure or at atmospheric pressure, depending on the kind of process which is or has to be carried out therein, for example, depending on the type of radiation used in case a lithographic process is or has to be carried out in the chamber. For example, the pressure in the apparatus may be a substantially atmospheric pressure or a higher pressure during the lithographic manufacturing process. Then, the at least one chemical reagent may be supplied to the at one chamber of the apparatus for the removal of water therefrom, providing the above-mentioned advantages.

Different parts of the lithographic apparatus may be located in the same or in several chambers. For example, the substrate holder WT and mask support structure MT may be located in the same chamber or in separate chambers.

Further, for the case that different chemical reagents are used, each reagent supplier may include for example, one or more reservoirs containing these reagents.

What is claimed is:

1. A device manufacturing method comprising:
    patterning a beam of radiation with a patterning device;
    projecting the patterned beam of radiation onto a target portion of a substrate;
    supplying a chemical reagent to a chamber that holds the patterning device and/or the substrate; and
    removing water from the chamber with use of the chemical reagent.

2. A method according to claim 1, wherein said chemical reagent is active with the water for increasing the desorption of the water from said chamber.

3. A method according to claim 1, wherein said chemical reagent forms at least one complex with the water, and wherein said complex has a lower adsorption energy and/or weaker intermolecular forces than the water.

4. A method according to claim 1, wherein said chemical reagent forms at least one reaction product with the water, and wherein said reaction product has a lower adsorption energy and/or weaker intermolecular forces than the water.

5. A method according to claim 1, wherein said chemical reagent is active with the water for decomposing the water at least partly into volatile substances.

6. A method according to claim 1, wherein the at least one chemical reagent comprises a compounds selected from the group consisting of: silicon-containing compounds, halogen-containing compounds, and hydrocarbon compounds.

7. A method according to claim 6, wherein the hydrocarbon compounds comprise an oxygen atom and/or a nitrogen atom.

8. A method according to claim 1, wherein said at least one chemical reagent is supplied to said chamber before the patterned beam of radiation is projected onto the substrate.

9. A method according to claim 1, wherein said at least one chemical reagent is supplied to said chamber after the patterned beam of radiation is projected onto the substrate.

10. A method according to claim 1, wherein said chemical reagent is supplied to said chamber at least during part of the period when the patterned beam of radiation is projected onto the substrate.

11. A method according to claim 1, wherein said removing said water from said chamber comprises pumping reaction products and/or complexes, resulting from the reagent reacting with water, from said chamber.

12. A method according to claim 1, wherein at least part of an inner surface of said chamber is irradiated with UV light.

13. A method according to claim 12, wherein said UV light is DUV light having a wavelength of less than about 400 nm.

14. A method according to claim 1, further comprising heating a wall of said chamber at a temperature of about 100° C. or less.

15. A method according to claim 14, wherein the temperature is about 60° C. or less.

16. A method according to claim 15, wherein the temperature is about room temperature.

17. A method according to claim 1, wherein said substrate and/or patterning device is transported through said chamber, when replacing the substrate and/or patterning device.

18. A method according to claim 1, further comprising applying a vacuum to remove the water after the chemical agent has acted thereupon.

19. A lithographic apparatus comprising:
    an illumination system for conditioning a beam of radiation;
    a support for supporting a patterning device, the patterning device serving to impart the beam of radiation with a pattern in its cross-section;
    a substrate table for holding a substrate;
    a projection system for projecting the patterned beam onto a target portion of the substrate;
    a chamber that holds the support, or the patterning device, or the projection system, or the substrate table, or the substrate, or any combination thereof; and
    a chemical reagent supply constructed and arranged to supply a chemical reagent to said chamber, the reagent being chemically active with water.

20. An apparatus according to claim 19, wherein said reagent supply comprises a reservoir containing the chemical reagent, wherein said reservoir is connectable to and/or integrated in said chamber to supply the chemical reagent to said chamber.

21. An apparatus according to claim 19, further comprising a handler constructed and arranged to transport said substrate and/or said patterning device, wherein said chamber comprises at least part of said handler.

22. An apparatus according to claim 19, further comprising a heater for heating a wall of said chamber and/or at least part of the content of said chamber.

23. An apparatus according to claim 19, further comprising a UV light source constructed and arranged to illuminate at least part of an inner surface of the chamber with UV light.

24. An apparatus according to claim 23, wherein the UV light is DUV light having a wavelength of less than about 400 nm.

25. An apparatus according to claim 19, wherein the chamber is a vacuum chamber.

26. A method for removing water from a chamber of a lithographic apparatus, the method comprising:
    supplying a chemical reagent to said chamber to remove said water from said chamber,
    wherein the chemical reagent comprises a compound selected from the group consisting of (ortho)carbonate/formate esters, carboxylic acid anhydrides, carboxylic acid esters, acetales, imines, trimethylsilyl ethers, silazanes, isocyanates, carbodiimides, and oxazolidines.

27. A method according to claim 26, wherein the chemical reagent comprises an aryl group and/or an alkyl group.

28. A method according to claim 26, wherein the chemical reagent comprises a methyl group, or an ethyl group, or a propyl group, or a butyl group, or any combination thereof.

* * * * *